(12) United States Patent
Fleming et al.

(10) Patent No.: US 8,014,428 B2
(45) Date of Patent: Sep. 6, 2011

(54) MODE-LOCKED LASER

(75) Inventors: Simon Fleming, Lane Cove (AU); Seong-Sik Min, Epping (AU); Yucheng Zhao, Dundas (AU)

(73) Assignee: University of Sydney, Sydney (AU)

( * ) Notice: Subject to any disclaimer, the term of this patent is extended or adjusted under 35 U.S.C. 154(b) by 0 days.

(21) Appl. No.: 12/601,939

(22) PCT Filed: May 30, 2008

(86) PCT No.: PCT/AU2008/000796
§ 371 (c)(1),
(2), (4) Date: Jan. 11, 2010

(87) PCT Pub. No.: WO2008/144849
PCT Pub. Date: Dec. 4, 2008

(65) Prior Publication Data
US 2010/0172380 A1    Jul. 8, 2010

(30) Foreign Application Priority Data
May 30, 2007 (AU) ................. 2007902901

(51) Int. Cl.
*H01S 3/098* (2006.01)
*H01S 3/30* (2006.01)
*H01S 3/13* (2006.01)

(52) U.S. Cl. .............. 372/18; 372/6; 372/29.02
(58) Field of Classification Search ........ 372/6, 18, 372/29.02, 29.023–31
See application file for complete search history.

(56) References Cited

U.S. PATENT DOCUMENTS

| | | | | |
|---|---|---|---|---|
| 5,050,183 A | * | 9/1991 | Duling, III | 372/94 |
| 5,359,612 A | * | 10/1994 | Dennis et al. | 372/18 |
| 5,812,567 A | | 9/1998 | Jeon et al. | |
| 5,999,545 A | | 12/1999 | Jeon et al. | |
| 6,163,630 A | * | 12/2000 | Evans | 385/11 |
| 2006/0245456 A1 | * | 11/2006 | Lasri et al. | 372/18 |
| 2008/0144676 A1 | * | 6/2008 | Nicholson | 372/18 |

FOREIGN PATENT DOCUMENTS

| | | |
|---|---|---|
| GB | 2307591 A | 5/1997 |
| WO | 9216037 A1 | 9/1992 |

* cited by examiner

*Primary Examiner* — Jessica T Stultz
*Assistant Examiner* — Phillip Nguyen
(74) *Attorney, Agent, or Firm* — Senniger Powers LLP

(57) ABSTRACT

The present disclosure provides in a first aspect a mode-locked laser for generating laser pulses. The mode-locked laser comprises an optical coupler and a first optical path capable of carrying optical signals from and to the optical coupler. The first optical path includes an optical amplifier that is arranged so that saturation of optical amplification causes amplitude modulation of the light. The optical amplifier has a saturation time that is shorter than a pulse transition period of the mode-locked laser and is arranged for recovery of amplifying properties after the saturation within a period of time that is shorter than the pulse transition period of the mode-locked laser. The laser further comprises a second optical path capable of carrying optical signals from and to the optical coupler. The second optical path includes an optical isolator. The first optical path has a non-linear property and is arranged so that, when a light pulse that is received from the second optical path is split by the optical coupler into component light pulses that are directed in opposite directions in the first optical path, the component light pulses experience differing shifts in phase and wherein the mode-locked laser is arranged so that mode-locked lasing is initiated by a light pulse that is amplitude modulated by the optical amplifier.

16 Claims, 3 Drawing Sheets

MODE-LOCKED LASER

FIELD OF THE INVENTION

The present invention broadly relates to a mode-locked laser and relates particularly, though not exclusively, to a mode-locked fibre laser.

BACKGROUND OF THE INVENTION

Lasers are widely used as sources of monochrome and coherent light in telecommunication industry and other industries. Known laser types include for example gas discharge lasers, laser diodes and fibre lasers.

Fibre lasers provide an alternative to conventional bulk lasers and offer high efficiency, high beam quality, excellent heat dissipation and are typically of a relatively small size.

A typical fibre laser may comprise an erbium doped amplifying medium that is optically pumped by a laser diode. The optical pumping results in inversion and suitable light that is guided through the amplifying medium causes stimulated light emission. The amplifying medium may be positioned between two Bragg gratings so that a laser cavity is formed and monochrome laser light is generated.

For some applications pulsed laser sources are required and recently a mode-locked figure-eight laser has been developed. The figure-eight laser includes a non-linear optical fibre and an amplifying medium in a first loop, which provides an amplifying loop mirror for light that is guided in an optically coupled second loop.

A phase shift that light will experience when guided through the non-linear optical fibre of the first loop depends on the light intensity and consequently light that passes through the amplifying medium before passing through the non-linear optical fibre will experience a phase shift that is different to that of light guided in an opposite direction. Interference of light guided in both directions and a suitable optical coupler is used to generate pulsed light having desired properties.

In a known passively mode-locked laser a pulse that initiates the lasing originates from optical noise fluctuation. In an actively mode-locked laser, mode-locking typically is generated using an optical modulator which is electronically controlled and is used to control a pulse.

In particular passively mode-locked figure-eight fibre lasers have been of interest for many applications as they are of relatively low cost and simple construction. However, as the initiating pulse originates from noise, the lasing performance, which depends on the properties of the initiating pulse, is of poor repeatability and the laser often has unpredictable performance.

The present invention provides technological advancement.

SUMMARY OF THE INVENTION

The present invention provides in a first aspect a mode-locked laser for generating laser pulses, the mode-locked laser comprising:
an optical coupler;
a first optical path capable of carrying optical signals from and to the optical coupler, the first optical path including an optical amplifier that is arranged so that saturation of optical amplification causes amplitude modulation of light, the optical amplifier having a saturation time that is shorter than a pulse transition period of the mode-locked laser and being arranged for recovery of amplifying properties after the saturation within a period of time that is shorter than the pulse transition period of the mode-locked laser; and
a second optical path capable of carrying optical signals from and to the optical coupler, the second optical path including an optical isolator;
wherein the first optical path has a non-linear property and is arranged so that, when a light pulse that is received from the second optical path is split by the optical coupler into component light pulses that are directed in opposite directions in the first optical path, the component light pulses experience differing shifts in phase and wherein the mode-locked laser is arranged so that mode-locked lasing is initiated by a light pulse that is amplitude modulated by the optical amplifier.

Throughout this specification the term "pulse transition period" is used for a period of time required for a light pulse to travel from a region of the mode locked laser and to return to the region of the mode locked laser.

The first optical path typically is a first optical loop and the second optical path typically is a second optical loop.

The mode-locked laser typically is arranged so that the first component pulse and the second component pulse interfere at the optical coupler with a phase difference of substantially $\pi$ after travelling through the first optical path.

In one specific embodiment of the present invention the non-linearity of the first optical path is substantially entirely or at least partially provided by non-linear optical properties of the optical amplifier. Alternatively, the non-linearity may largely be provided by a component other than the optical amplifier.

The first and second optical paths typically comprise optical waveguides which may be substantially entirely optically linear. Alternatively, the optical waveguide of the first optical path may include at least one nonlinear waveguide portion, in which case the non-linear waveguide portion contributes to the non-linear properties of the first optical path.

For example, the optical amplifier may be a semiconductor optical amplifier (SOA).

Further, the first optical path may include a further amplifier, such as an erbium doped fibre amplifier.

The mode-locked laser has significant technological advantages. A light intensity peak that originates from optical noise (such as optical noise associated with spontaneous photon emission) may be amplified by the optical amplifier in a manner such that the optical amplifier saturates quickly whereby the light intensity peak is amplitude modulated. The subsequent recovery period of the optical amplifier will then reduce or inhibit amplification for a period of time. As the intensity of immediately following peaks is at least partially suppressed due to the recovery period of the optical amplifier, well defined initiating pulses may be generated. Consequently, passive mode-locking can be achieved in a manner such that the laser performance is predictable and repeatable and shapes of laser pulses are controllable by controlling properties of the optical amplifier, such as the saturation period of the optical amplifier.

Further, the above-described mode-locked laser has the advantage that relatively high pulse rates are possible. A decrease in time required for recovery of the optical amplifier increases the number of periodically generated pulses and thereby the pulse rate. The optical amplifier typically has a recovery period after saturation that is at least 2, at least 5, at least 10, at least 20, at least 100 or even more than 150 times shorter than the pulse transition period of an individual pulse. Consequently, the optical amplifier may be arranged so that the pulse rate is increased by a factor of at least 2, at least 5, at least 10, at least 20, 100, or even more than 150 compared with the pulse rate of a known Figure-eight laser. In a specific embodiment of the present invention the mode-locked laser is arranged so that the pulse frequency is in the sub GHz to GHz range, or even substantially higher than that.

The saturation period of the optical amplifier may be of any suitable time that is shorter than the pulse transition period, such as of the order of 1 ps.

In the above-described example the second optical path typically is largely or substantially entirely optically linear and arranged for recirculating at least a portion of generated optical pulses.

The mode-locked laser typically is a harmonic mode-locked laser.

The non-linear and linear optical waveguides may be planar optical waveguides, but typically are optical fibres.

The optical isolator typically is polarisation insensitive and typically is arranged to block reflected light pulses that do not satisfy a total transmission condition of the mode-locked laser.

The present invention provides in a second aspect a method of generating laser pulses, the method comprising:

providing a laser that is suitable for generating a mode-locked laser signal, the laser comprising an optical amplifier that is arranged for recovery of amplifying properties after saturation within a period of time that is shorter than a pulse transition period of the mode-locked laser;

receiving or generating an optical signal by the optical amplifier;

amplifying the optical signal using the optical amplifier in a manner such that the optical amplifier is saturated as a result of the amplification of the optical signal whereby the optical signal is amplitude modulated; and using the amplitude modulated optical signal and non-linear optical properties of the mode-locked laser to initiate mode-locked lasing.

The optical non-linearity typically is substantially entirely or at least partially provided by non-linear optical properties of the optical amplifier.

Alternatively, the optical non-linearity may be largely provided by a component other than the optical amplifier.

The method may also comprise the step of controlling a light pulse repetition rate and other properties of laser pulses by controlling a recovery period after saturation of the optical amplifier.

The optical amplifier typically is a semiconductor optical amplifier.

Further, the method may comprise the step of controlling properties of the laser pulses, such as pulse duration, by controlling saturation properties of the optical amplifier.

The invention will be more fully understood from the following description of specific embodiments of the invention. The description is provided with reference to the accompanying drawings.

DETAILED DESCRIPTION OF SPECIFIC EMBODIMENTS

Figure 1:
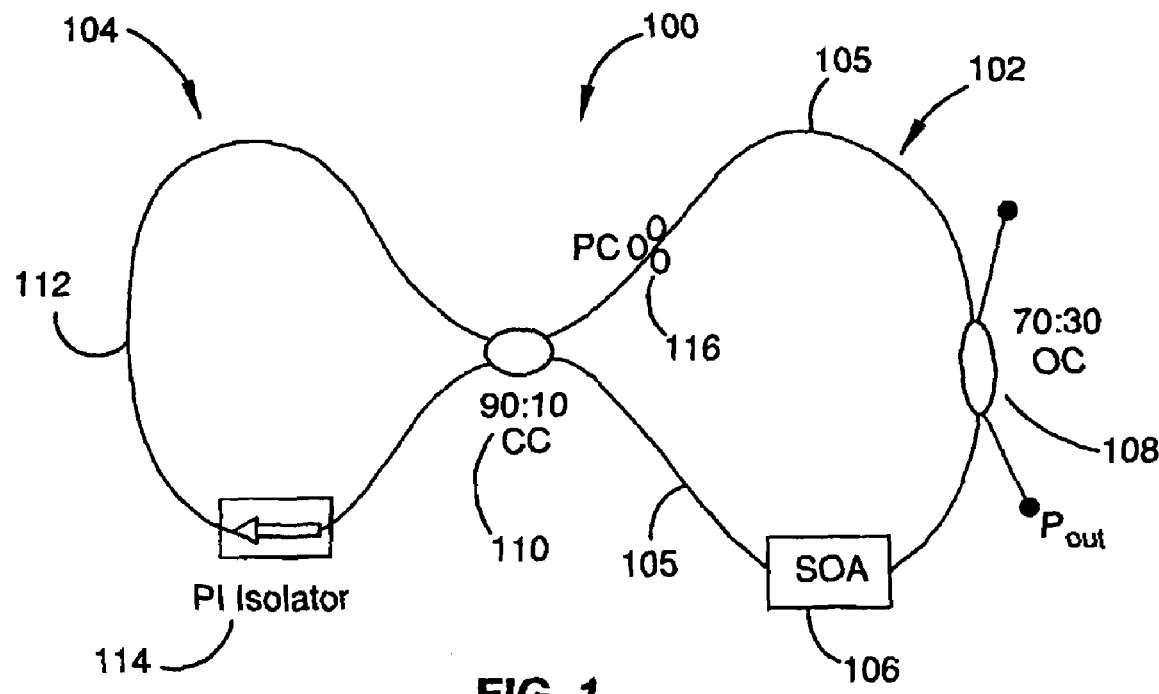
FIG. 1 shows a schematic representation of a mode-locked laser according to a first specific embodiment of the present invention.

Referring initially to FIG. 1, a mode-locked laser according to a first specific embodiment of the present invention is now described.

FIG. 1 shows an example 100 of the mode-locked laser. In this embodiment the mode-locked laser forms a "figure-eight laser" arrangement and comprises a first optical loop 102 and a second optical loop 104. The first optical loop 102 comprises a linear optical fibre portion 105, a semiconductor optical amplifier 106 and an optical 70:30 coupler 108. The first loop 102 also comprises a polarization controller 116. The first loop 102 is coupled to the second loop 104 by a 90:10 optical coupler 110.

The second loop 104 comprises a linear optical fibre 112 with a polarization independent isolator 114 and functions as a cavity in which generated laser pulses circulate. The first loop 102 functions as a saturable amplifying mirror for that cavity.

Mode-locked lasing is initiated as follows. A light pulse originates from optical noise that may be generated by the semiconductor optical amplifier 106 and is amplified by the semiconductor optical amplifier 106. The semiconductor optical amplifier 106 is arranged so that a relatively large amplification is achieved and the semiconductor optical amplifier 106 saturates as a result of the relatively large optical power level. The saturation is followed by a recovery period during which amplification is significantly reduced. Consequently, the semiconductor optical amplifier 106 modulates the amplitude of received signals and generates relatively large and well-defined pulses that are used for initiating the mode-locked lasing.

Each generated pulse is then directed into the second loop 104 via the optical coupler 110 and subsequently returns into the first optical loop 102. The optical coupler 110 splits the returning light pulse into two component light pulses that are directed through the first optical loop 102 in opposite directions. A first component pulse may be amplified by the semiconductor optical amplifier 106 which results in saturation of the semiconductor optical amplifier 106. The semiconductor optical amplifier 106 is positioned within the first optical loop 102 at a position selected so that the second component pulse, travelling in the opposite direction, reaches the semiconductor optical amplifier 106 when the semiconductor optical amplifier 106 is saturated. As the differing amplifications result in differing effective refractive indices, the first and second component pulses will experience differing phase shifts. The first loop 102 typically is arranged so that the component pulses interfere at the optical coupler 110 with a phase difference of π and the optical coupler 110 then directs the light mainly in one direction through the second optical loop 104 and stable laser operation is achieved.

The polarization controller 116 can be used to select a preferential polarization Eigenstate of the laser cavity and an output of laser light is receivable at the optical coupler 108.

Because of the "self modulation" by the semiconductor optical amplifier 106, the mode-locking is passive and the laser 100 is self-starting. In particular, typical problems of conventional passive mode-locked figure-eight lasers, such as initial operation in a continuous mode and different lasing properties each time the laser is used, can be avoided.

A relatively short recovery period of the optical amplifier 106 enables generating a relatively large number of pulses which each result in the above-described operation of the mode-locked laser 100 and consequently a relatively short recovery period results in a relatively high pulse rate. For example, the pulse rate may be more than 10, 100 or even more than 150 times larger than the pulse rate of a known FIG. 8 laser with the fundamental pulse rate determined by the optical path length.

Stable operation with a pulse rate of 641 MHz was observed for an optical path length of 19.2 m. This pulse rate was approximately 66 times higher than a fundamental pulse repetition rate of 9.58 MHz that would be achievable using a known Figure-eight laser arrangement having a comparable optical path length.

Figure 2:
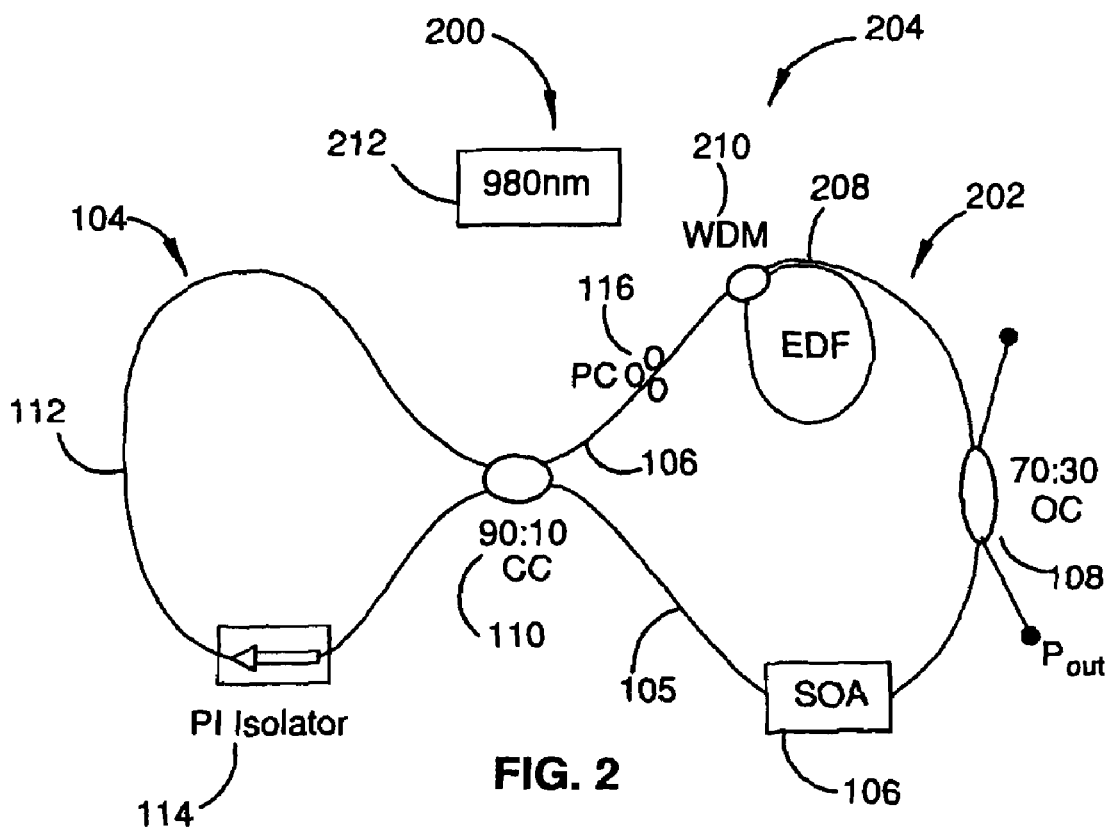
FIG. 2 shows a schematic representation of a mode-locked laser according to a second specific embodiment of the present invention.

FIG. 2 shows a mode-locked laser 200 according to a second specific embodiment of the present invention. In addition to the components of the laser 100 shown in FIG. 1, the laser 200 further includes in this example an erbium doped fibre amplifier 204 in a first loop 202. The erbium doped fibre amplifier 204 includes an erbium doped fibre 208, a wavelength division multiplexer (WDM) 210 and a Laser diode 212 arranged to provide light for optically pumping the erbium doped fibre 208 and thereby cause inversion. Further, the first loop 202 includes in this embodiment a non-linear optical fibre portion 214, which contributes to the non-linear optical properties of the second optical loop 202. Optical properties of the laser 200 depend on the length of the non-linear optical fibre portion 202, properties of the erbium doped fibre amplifier 204 and the saturation properties of the semiconductor-optical amplifier 106.

The main laser amplification of the laser 200 is achieved by the erbium doped fibre amplifier 204 and the amplification is supplemented by the amplification of the semiconductor optical amplifier 106. In this embodiment, the non-linear amplifying loop 202 has a length of 22.48 m and the linear optical loop (second optical loop) 104 has a length of 4.3 m. The wavelength division multiplexer 210 is arranged for 980/1550 nm wavelength division multiplexing for supplying 980 nm pump light from laser diode 212 and laser operation at the wavelength of 1550 nm.

Figure 3:
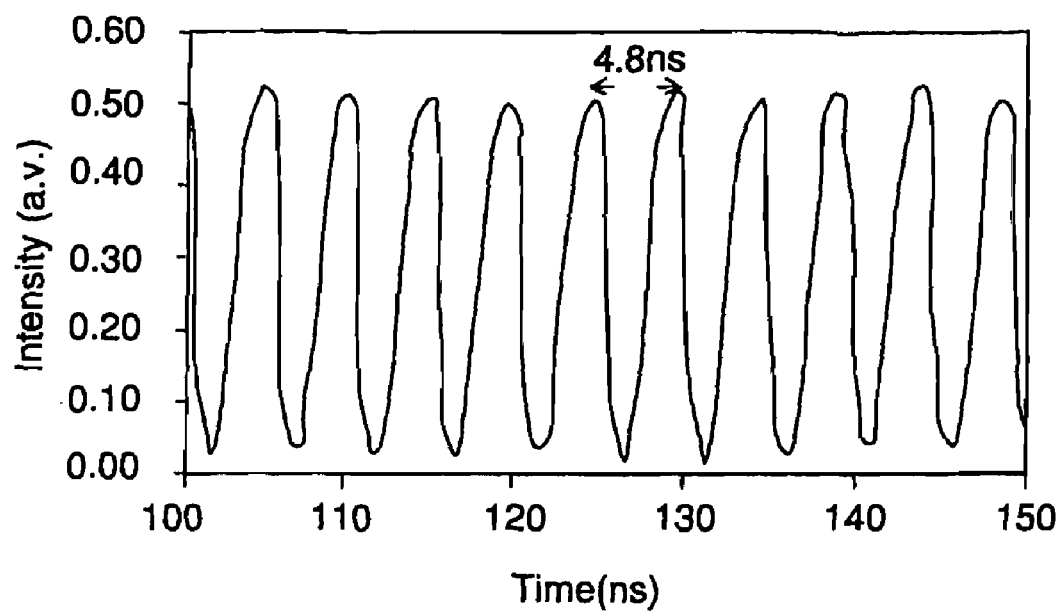
FIGS. 3 and 4 show plots that characterize optical pulses generated using a mode-locked laser according to a specific embodiment of the present invention.
Figure 4:
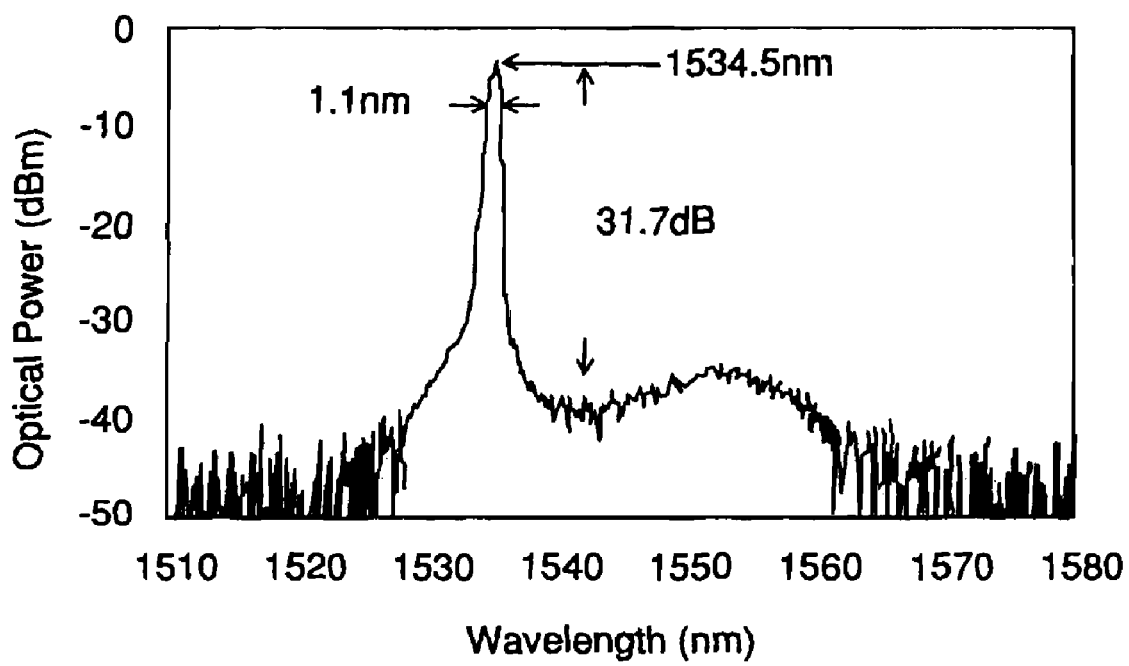

FIGS. 3 and 4 show plots and characterize optical pulses that are generated by the mode-locked laser 200. FIG. 3 shows a pulse train having a time separation of 4.8 ns between adjacent peaks. FIG. 4 shows an optical spectrum of a pulse having a bandwidth of approximately 1.1 nm. and wavelength of 1534.5 nm. The laser peak is 31.7 dB above the background noise.

The data characterise stable pulses with a pulse rate of approximately 210 MHz, which corresponds to approximately 20 times the fundamental repetition rate of a conventional figure-eight fibre laser with the same cavity length. The measured full-width half-maximum of the pulses was 2.28 ns and the average output power was about 11 mW at 165 mW erbium doped fibre amplifier pump power and 105 mA semiconductor optical amplifier current.

Figure 5:
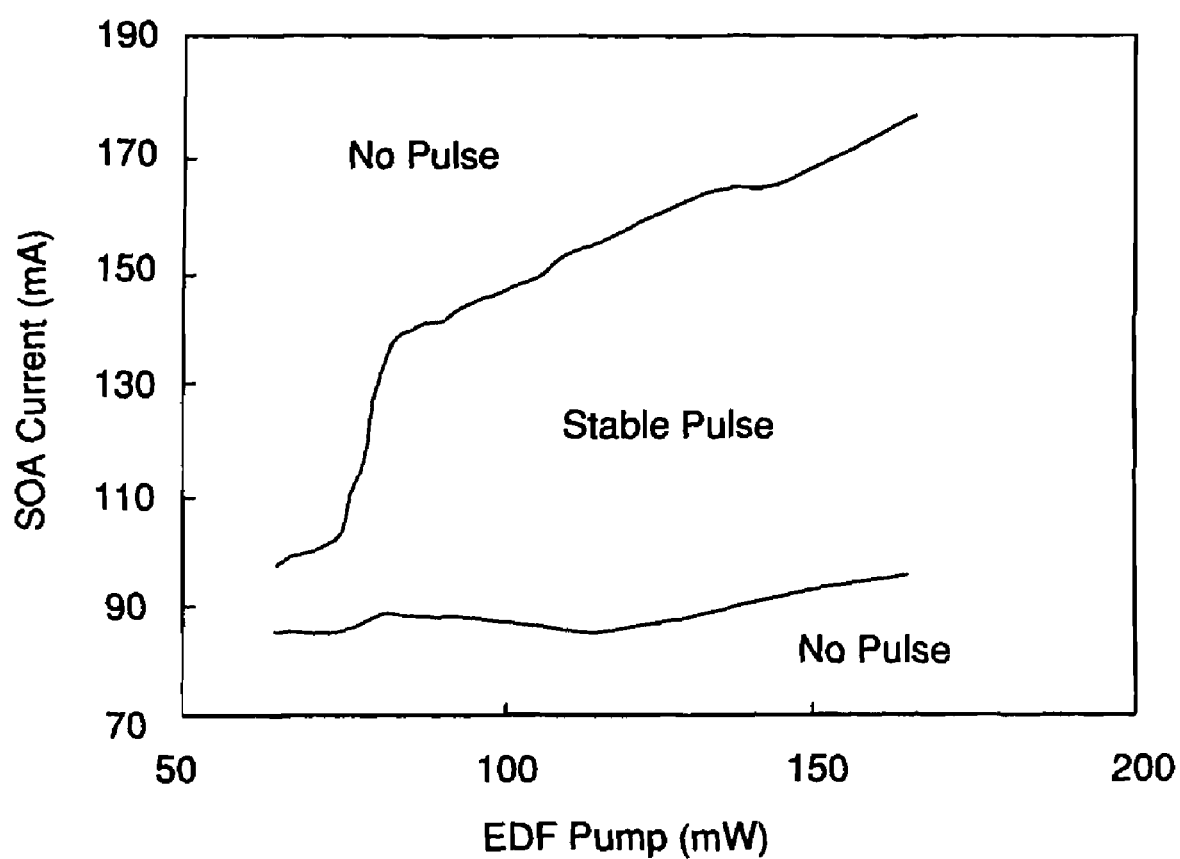
FIG. 5 shows plots that characterize optical properties of a mode-locked laser according to a specific embodiment of the present invention.

FIG. 5 shows a plot that characterizes current ranges of the semiconductor optical amplifier 106 and pump power ranges of the erbium doped fibre amplifier 204 for which stable pulse trains can be obtained using a mode-locked laser according to a specific embodiment of the present invention, such as laser 200. Regardless of the pump power of the erbium doped fibre amplifier 204, above a current of 89 mA of the semiconductor optical amplifier 106 a stable pulse train is observable for pump powers in excess of approximately 62 mW.

Although the invention has been described with reference to particular examples, it will be appreciated by those skilled in the art that the invention may be embodied in many other forms. For example, the mode-locked laser may not necessarily be arranged in a figure-eight arrangement, but may also comprise a different number of optical loops that form a suitable arrangement. Further, the mode-locked laser may comprise a semiconductor optical amplifier and a non-linear optical fibre portion in the first loop, but may not comprise a fibre amplifier. Alternatively, the mode-locked laser may comprise the fibre amplifier in addition to the semiconductor optical amplifier, but may not comprise a non-linear optical fibre portion. In addition, the semiconductor optical amplifier may be replaced with another type of amplifier having suitable properties.

Further, in a variation of the described embodiments light may not necessarily be guided in waveguides. For example, light may be directed from one optical component of the laser to another through free space or an optically transmissive medium and may be diverted using mirrors or devices that function as mirrors. The optical coupler may for example be provided in the form of a beam splitter.

The invention claimed is:

1. A mode-locked laser for generating laser pulses, the mode-locked laser comprising:
an optical coupler;
a first optical path capable of carrying optical signals from and to the optical coupler, the first optical path including an optical amplifier that is arranged so that saturation of optical amplification causes amplitude modulation of light, the optical amplifier having a saturation time that is shorter than a pulse transition period of the mode-locked laser and being arranged for recovery of amplifying properties after the saturation within a period of time that is shorter than the pulse transition period of the mode-locked laser; and
a second optical path capable of carrying optical signals from and to the optical coupler, the second optical path including an optical isolator;
wherein the first optical path has a non-linear property and is arranged so that, when a light pulse that is received from the second optical path is split by the optical coupler into component light pulses that are directed in opposite directions in the first optical path, the component light pulses experience differing shifts in phase and wherein the mode-locked laser is arranged so that mode-locked lasing is initiated by a light pulse that is amplitude modulated by the optical amplifier.

2. The mode-locked laser of claim 1 wherein the first optical path is a first optical loop and the second optical path is a second optical loop.

3. The mode-locked laser of claim 1 being arranged so that a first component pulse and a second component pulse of the component light pulses interfere at the optical coupler with a phase difference of substantially $\pi$ after travelling through the first optical path.

4. The mode-locked laser of claim 1 wherein the non-linearity of the first optical path is substantially entirely provided by non-linear optical properties of the optical amplifier.

5. The mode-locked laser of claim 1 wherein the non-linearity of the first optical path is partially provided by non-linear optical properties of the optical amplifier.

6. The mode-locked laser of claim 1 wherein the non-linearity is largely provided by a component other than the optical amplifier.

7. The mode-locked laser of claim 1 wherein the first and second optical paths comprise optical waveguides.

8. The mode-locked laser of claim 7 wherein the optical waveguide of the first optical path includes at least one non-linear waveguide portion.

9. The mode-locked laser of claim 1 wherein the optical amplifier is a semiconductor optical amplifier (SOA).

10. The mode-locked laser of claim 1 wherein the first optical path includes a further amplifier.

11. The mode-locked laser of claim 10 wherein the further amplifier is an erbium doped fibre amplifier.

12. The mode-locked laser of claim 1 wherein the optical amplifier has a recovery period after saturation that is one of at least 2, at least 5, at least 10, at least 20, at least 100 or more than 150 times shorter than the pulse transition period of an individual pulse.

13. The mode-locked laser amplifier of claim 1 wherein the mode-locked laser is arranged so that the pulse frequency is in the sub GHz to GHz range.

14. The mode-locked laser amplifier of claim 1 wherein the mode-locked laser is arranged so that the pulse frequency is above the GHz range.

15. The mode-locked laser of claim 1 being a harmonic mode-locked laser.

16. The mode-locked laser of claim 7 wherein the optical waveguides are optical fibres.

* * * * *